(12) United States Patent
Chu

(10) Patent No.: US 8,432,061 B2
(45) Date of Patent: Apr. 30, 2013

(54) DIGITAL FREQUENCY DIVIDER

(71) Applicant: Maxim Integrated Products, Inc., San Jose, CA (US)

(72) Inventor: Min Chu, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/675,247

(22) Filed: Nov. 13, 2012

(65) Prior Publication Data

US 2013/0070832 A1    Mar. 21, 2013

Related U.S. Application Data

(62) Division of application No. 12/915,499, filed on Oct. 29, 2010.

(51) Int. Cl.
*H02J 1/00*    (2006.01)
*H02J 3/00*    (2006.01)

(52) U.S. Cl.
USPC .......................................................... 307/15

(58) Field of Classification Search ...................... 307/15
See application file for complete search history.

(56) References Cited

U.S. PATENT DOCUMENTS

| | | | | |
|---|---|---|---|---|
| 4,882,549 A * | 11/1989 | Galani et al. | | 331/14 |
| 5,307,029 A * | 4/1994 | Schenk | | 331/37 |
| 5,877,641 A * | 3/1999 | Ziegler et al. | | 327/156 |
| 6,150,891 A * | 11/2000 | Welland et al. | | 331/25 |
| 6,549,765 B2 * | 4/2003 | Welland et al. | | 455/260 |
| 6,696,870 B2 * | 2/2004 | Dellow | | 327/115 |
| 6,741,846 B1 * | 5/2004 | Welland et al. | | 455/260 |
| 7,071,996 B2 * | 7/2006 | Naegle | | 348/500 |
| 7,365,797 B2 * | 4/2008 | Choi et al. | | 348/537 |
| 8,203,472 B2 * | 6/2012 | Robinson | | 341/118 |
| 2004/0012578 A1 * | 1/2004 | Naegle | | 345/204 |
| 2005/0063474 A1 * | 3/2005 | Choi et al. | | 375/240.28 |
| 2005/0078126 A1 * | 4/2005 | Park et al. | | 345/665 |
| 2007/0041484 A1 * | 2/2007 | Khanoyan | | 375/376 |
| 2007/0041487 A1 * | 2/2007 | Khanoyan | | 377/48 |
| 2008/0164917 A1 * | 7/2008 | Floyd et al. | | 327/117 |
| 2008/0183098 A1 * | 7/2008 | Denison et al. | | 600/547 |
| 2010/0128837 A1 * | 5/2010 | Prakah et al. | | 377/47 |
| 2012/0068866 A1 * | 3/2012 | Robinson | | 341/118 |
| 2012/0161830 A1 * | 6/2012 | Banin et al. | | 327/156 |

* cited by examiner

*Primary Examiner* — Adam Houston
(74) *Attorney, Agent, or Firm* — North Weber & Baugh LLP

(57) ABSTRACT

Various embodiments of the present invention relate to systems, devices and method of frequency synthesis that generate in-phase and quadrature-phase clock signals at a programmable frequency. The generated frequency, which can range from a fraction to multiples of the input reference frequency, is generated by dividers following a phase-locked loop, thus avoiding the use of a low input reference frequency as well as frequency doubling.

8 Claims, 8 Drawing Sheets

DIGITAL FREQUENCY DIVIDER

CROSS REFERENCE TO RELATED PATENT APPLICATIONS

This application is a divisional of and claims priority to U.S. patent application Ser. No. 12/904,005, filed Oct. 29, 2010, entitled "A Programmable Frequency Divider with I/Q Outputs," which is herein incorporated by reference in its entirety.

BACKGROUND

A. Technical Field

The present invention relates to the field of electronics and data communications, and more particularly, to a programmable frequency synthesizer that generates both in-phase and quadrature-phase clock signals over a wide bandwidth.

B. Background of the Invention

Frequency synthesizers are electronic components for generating specific frequencies in reference to a fixed frequency provided by an external reference oscillator, and they are widely applied in modern communication systems, including radio receivers, mobile telephones, GPS systems and satellite receivers. The reference oscillator is normally a crystal oscillator that includes a vibrating crystal of piezoelectric material, so the reference frequency is maintained precise and stable. The core of a frequency synthesizer typically comprises a phase-locked loop (PLL) that aligns the phase and frequency of the output signal with the input reference. To obtain a fractional division ratio, a prescaler is used to reduce the input reference frequency by an integer ratio before it is sent to the phase-locked loop.

At a low reference frequency, the performance and cost efficiency tends to be degraded for the phase-locked loop. A typical phase-locked loop comprises a phase detector (PD), a charge pump (CP), a loop filter, a voltage controlled oscillator (VCO), and a feedback frequency divider. The phase detector detects the phase difference between the output of the feedback frequency divider and the reference input; and the charge pump converts this phase difference to current. However, at a low operating frequency, the small charge-pump current increases the implementation difficulty. Moreover, the subsequent loop filter requires the use of large capacitors to reach a narrow bandwidth, typically less than one tenth of the input reference frequency. Regardless of this loop filter being on- or off-chip, cost efficiency of the entire component may be significantly reduced due to the large chip area or additional on-board components. In addition, with a low cut-off frequency, the frequency synthesizer requires a long time to settle; for example, for a loop bandwidth of 5 kHz, the settling time may last 200 μsec. Therefore, frequency synthesizers functioning at low frequencies are undesirable due to performance and cost efficiency degradation of the phase-locked loop.

Most communication systems only require their internal clock signals to be programmed to a number of frequencies within a limited range. However, for data transmission applications such as the Mobile Industry Processor Interface (MIPI), the clocking frequencies must vary over a wide range from fractions to multiples of the reference frequency while both in-phase and quadrature-phase (I/Q) clock signals are required. Due to the aforementioned limitations of the phase-locked loop, the conventional frequency synthesizer needs to be modified to accommodate low reference frequencies. One solution is the digital Σ-Δ fractional PLL. In the Σ-Δ PLL, the feedback frequency divider is usually a dual-modulus divider with the modulus control being the output of a digital Σ-Δ modulator. This approach not only increases design complexity but also introduces undesirable jitter and spurious sidebands. A need exists to provide a convenient solution to generate programmable clock signals covering a wide bandwidth.

A quadrature-phase clock signal is a signal delayed from the clock a quarter of cycle. A typical method of generating the quadrature-phase signal is to double the input clock, and then followed by a divide-by-two counter. Conventionally, frequency doubling is implementable using XOR logic gates or inside the VCO. However, doubling the frequency increases design complexity, power consumption, and may inject high-frequency glitches to the output signals. A need exists to output clock signals while avoiding frequency doubling without increasing the design complexity or power consumption.

Programmability and I/Q outputs present challenges for clock generation, especially for high-performance, low-cost and easy-to-implement solutions.

SUMMARY OF THE INVENTION

Various embodiments of the present invention relate to systems, devices and methods of frequency synthesis that generate in-phase and quadrature-phase clock signals at a programmable output frequency. This programmable frequency synthesizer avoids all issues caused by low reference frequencies and is capable of generating a wide range of frequencies while keeping the system design efficient and cost effective.

Certain embodiments of the frequency synthesizer include an application processor, a phase-locked loop circuit followed by a digital frequency divider. The application processor defines a ratio the clock frequency is programmed to relative to the reference frequency. The programmable frequency synthesizer uses a post-scaler instead of a prescaler. In various embodiments, the phase-locked loop may receive the input reference clock directly, and only need to be optimized at the specific input frequency. However, one skilled in the art will recognize that intermediate components may be located between the input reference clock and the phase-locked loop. The frequency from the input reference is relatively high, making the PLL easy to implement. The post-scaler is a digital frequency divider further dividing the PLL output by the ratio sent from the application processor. To avoid frequency doubling and excessive power consumption, the post-scaler employs two sub-dividing stages. The first divider stage includes a duty cycle equalizer circuit to ensure a 50% duty cycle clock output so that the second divide-by-two stage may conveniently generate both in-phase and quadrature-phase clock signals.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("FIG.") 1 illustrates a block diagram of a conventional frequency synthesizer according to various embodiments of the invention.

DETAILED DESCRIPTION OF THE PREFERRED EMBODIMENTS

Embodiments of the present invention provide systems, devices and methods for frequency synthesis. In the following description, for purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of structures. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Figure 1:
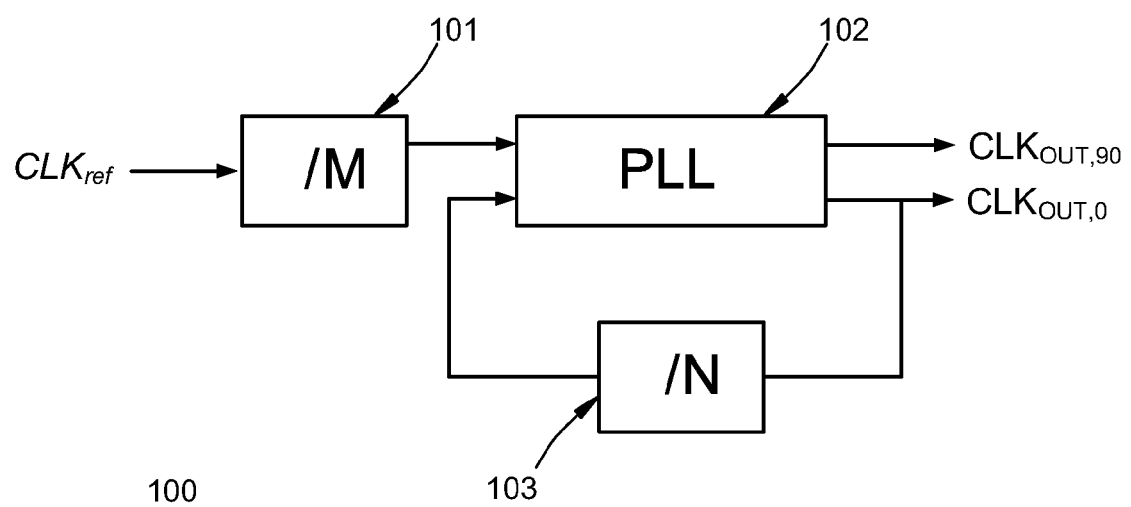

FIG. 1 illustrates a block diagram 100 of a conventional frequency synthesizer. The frequency synthesizer comprises a prescaler 101 and a phase-locked loop 102 whose output is returned as feedback to itself after being processed by a divide-by-N divider 103. The prescaler 101 is a divide-by-M divider receiving a reference clock signal and scaling the frequency by a factor of M. In the phase-locked loop 102, the output signal from the prescaler 101 is further compared to the feedback signal from the divide-by-N divider 103, and a DC voltage that is proportional to the phase difference is generated to control an internal VCO that generates a clock signal. The input clock frequency and phase to the phase-locked loop 102 is therefore closely tracked by the output of the feedback divider. Both in-phase and quadrature-phase clock signals are generated by the frequency synthesizer 100 and they have a frequency of $$f = f_0 \frac{N}{M},$$

where $f_0$ is the reference frequency, N and M are frequency-defining ratios implemented by the divider 103 and the prescaler 101, respectively. A varying parameter M inevitably leads to operating frequency variation in the phase-locked loop 102 which may increase design difficulties at low frequencies.

Figure 2:
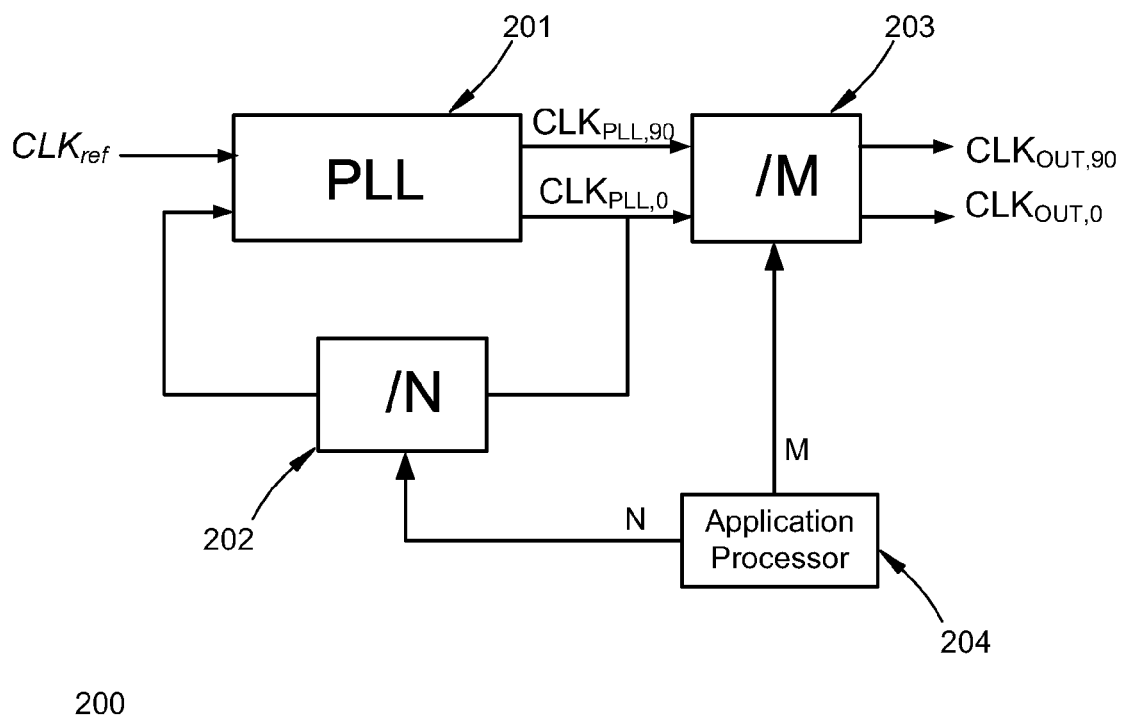
FIG. 2 illustrates a block diagram of a programmable frequency synthesizer with a wide bandwidth according to various embodiments of the invention.

FIG. 2 is a block diagram 200 of a programmable frequency synthesizer with a post-scaler. A reference clock is applied directly as an input to the phase-locked loop 201, and the output clock signal is still used as a feedback via a divide-by-N divider 202. Moreover, both in-phase and quadrature-phase clock signals are further used by a post-scaler 203 to have their frequency divided down by a factor of M. As a result, the final in-phase and quadrature-phase clock outputs generated by the frequency synthesizer 200 have a frequency of $$f = f_0 \frac{N}{M},$$

where $f_0$ is the reference clock frequency, N and M are frequency-defining ratios implemented by the phase lock divider 202 and the post-scaler 203, respectively. N and M are defined by an application processor 204 according to various applications. For example, with a reference clock frequency of 26 MHz, N of 4 and M ranging from 1 to 256, the programmable output frequency can vary by approximately three orders of magnitude from 406 kHz to 104 MHz.

Although frequency programmability may be conveniently implemented using the divide-by-M prescaler, various embodiments of the present invention allow the phase-locked loop to operate at a constant frequency determined by the reference clock. The charge pump, loop filter and VCO included in the phase-locked loop 201 only need to be optimized at the specific reference clock frequency or at a limited number of frequencies if the reference clock frequency varies. In the previous example where the reference clock frequency $f_0$ is 26 MHz and the output frequency $$f = f_0 \frac{N}{M}$$

varies between 406 kHz and 104 MHz, the phase-locked loop 201 only needs to be optimized for 26 MHz. However, the phase-locked loop 102 used in a conventional frequency synthesizer is required to accommodate all programmable reference frequencies. As previously discussed, optimizing a phase-locked loop at low frequencies imposes design challenges on the internal charge pump and degrades cost efficiency by requiring large chip area or external capacitor for the loop filter.

Figure 3:
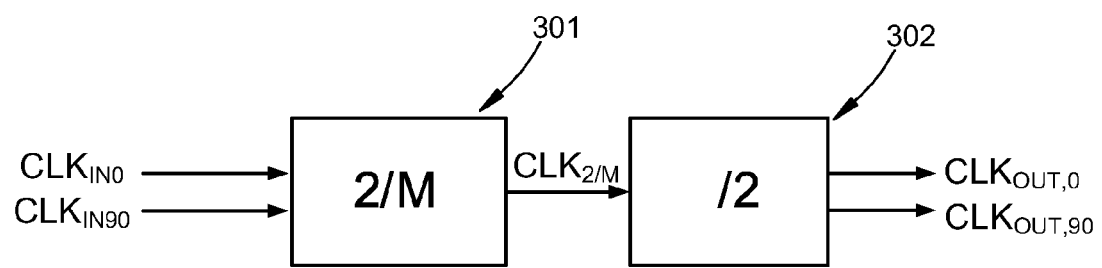
FIG. 3 illustrates a block diagram of a divide-by-M digital frequency divider according to various embodiments of the invention.

FIG. 3 is a block diagram 300 of a digital divide-by-M frequency divider which may be used as the post-scaler 203. This digital frequency divider 300 is intended to process the clock signal generated by the phase-locked loop 201, reduce the frequency by a factor of M and output in-phase and quadrature-phase clocks signals while avoiding circuit operating at a frequency higher than the PLL output frequency. In the embodiments of the present invention, the divider 300 effectively avoids frequency doubling and the associated problems without increasing design complexity. This digital divide-by-M divider 300 consists of two sub-divider stages, a divide-by-M/2 divider stage 301 and a divide-by-two divider stage 302. The first divider stage 301 receives in-phase and quadrature-phase clock signals $CLK_{PLL,0}$ and $CLK_{PLL,90}$, and generates an intermediate clock signal $CLK_{2/M}$ at a frequency that is 2/M times that of the input clock. The divider 301 also enforces the duty cycle of its output signal $CLK_{2/M}$ to be 50%. A signal having a 50% duty cycle stays at high for half of each clock cycle. The divide-by-two divider stage 302 is a conventional divide-by-two counter, which generates in-phase and quadrature-phase signals if the input clock has a precisely controlled 50% duty cycle. Therefore, the outputs of this digital frequency divider 300 are two clock signals whose phase difference is 90° and frequencies are both 1/M of the input clock frequency.

Figure 4:
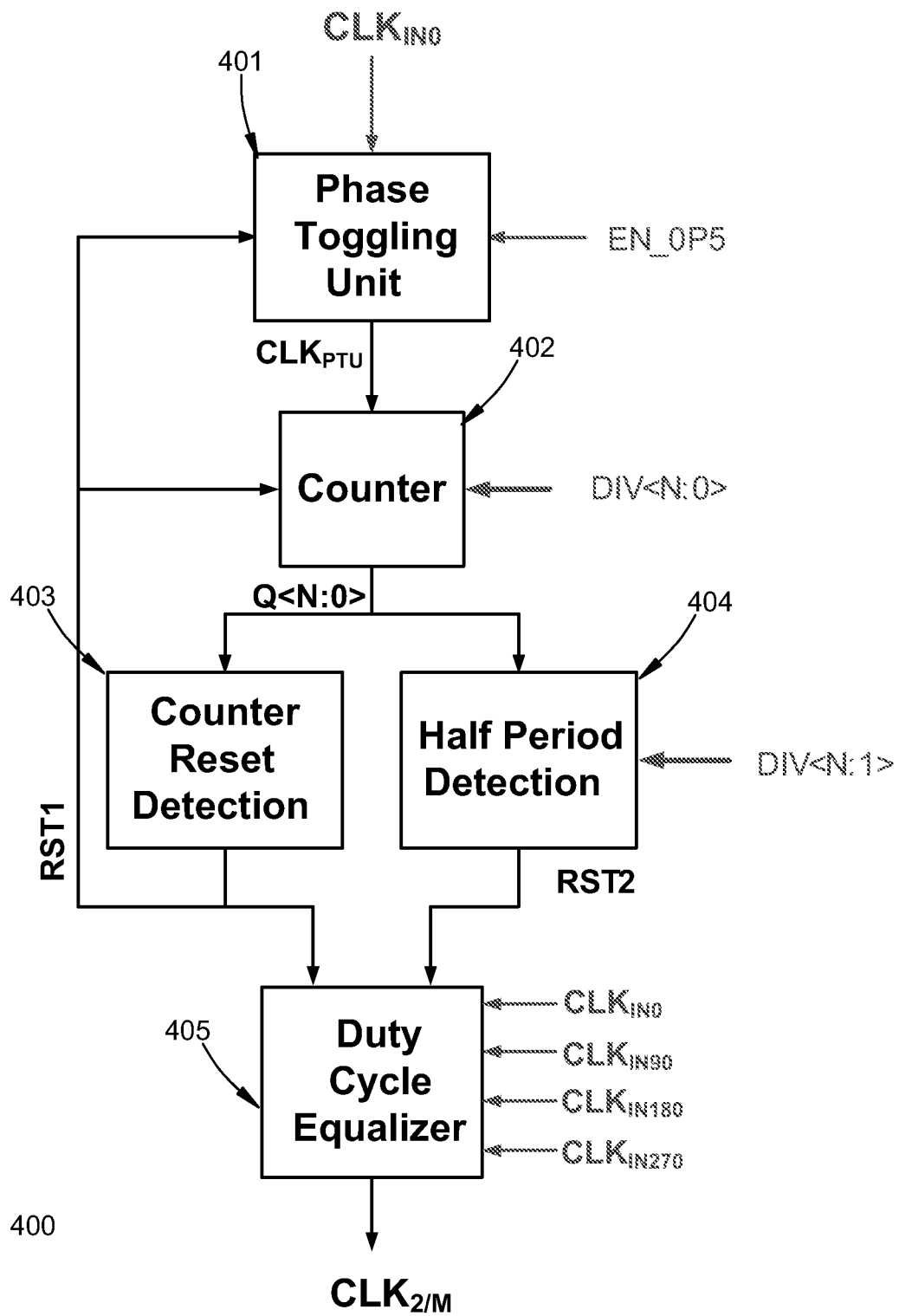
FIG. 4 illustrates a block diagram of a divide-by-M/2 frequency divider according to various embodiments of the invention.

The divide-by-M/2 frequency divider 301 is the core of frequency programmability and a block diagram 400 that illustrates the basic functions and data path is shown in FIG. 4. The even or odd M cases have to be differentiated due to the 50% duty cycle requirement on the output clock signal. Therefore, a fraction-enable signal EN_0P5 is employed to acknowledge the divider 301 whether a division by an odd or even integer M needs to be implemented, 1 for odd and 0 for even, respectively. The magnitude of M/2 is rounded to an integer K, represented by a multiple-bit binary signal DIV<N:0>. Consequently, for an even M, K is equal to M/2 and EN_0P5 is 0 while for an odd M, K is equal to (M−1)/2 and EN_0P5 is 1. In the case of an odd M, division by M/2 is also referred to as division by K.5 and the divide-by-M/2 divider 301 is referred to as a divide-by-K.5 divider. The divider 301 relies on a counter to count K/2 (rounded if K is odd) clock cycles and a subsequent duty cycle equalizer to compensate the duty cycle to 50%. In various embodiments of the invention, the divide-by-M/2 frequency divider 301 comprises a phase toggling unit (PTU) 401, a counter 402, a counter reset detection block 403, a half period detection block 404 and a duty cycle equalizer 405.

Figure 5:
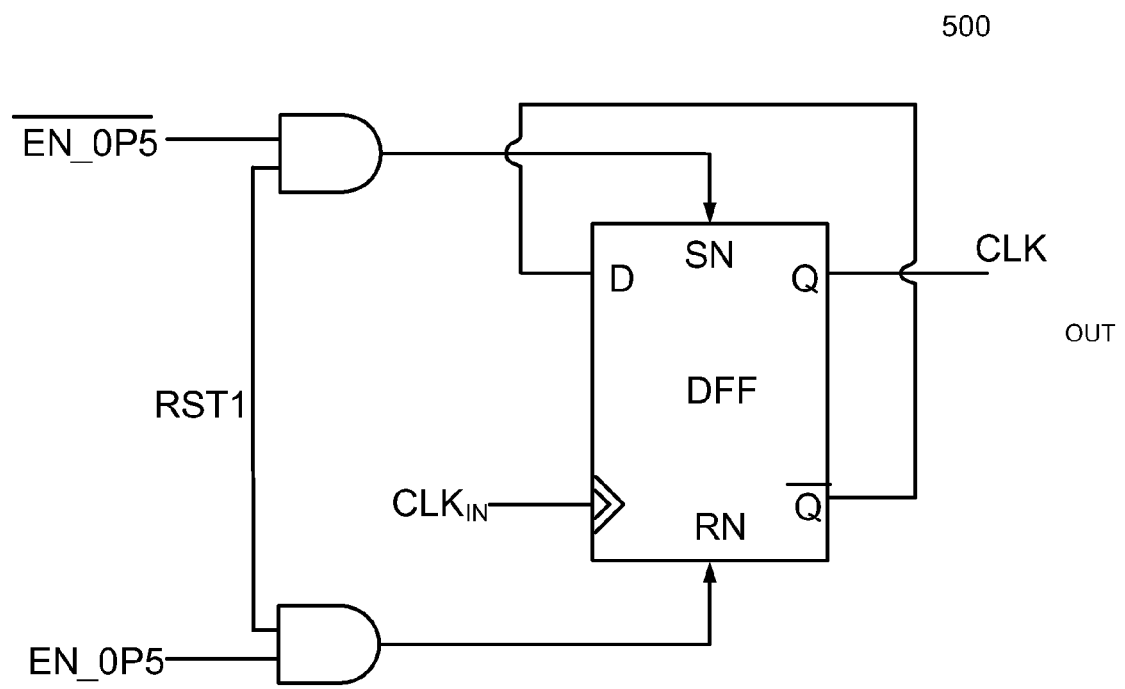
FIG. 5 illustrates a block diagram of a phase toggling unit according to various embodiments of the invention.

A phase toggling unit 401 may be employed for the purpose of preconditioning the input clock signal for the subsequent counter 402. In one embodiment, the phase toggling unit 401 receives an in-phase high frequency clock signal $CLK_{IN0}$ and is controlled by EN_0P5 and another reset signal RST1. RST1 is a feedback signal indicating that K (even M) or K.5 (odd M) cycles are counted by the subsequent counter 402 and the counter will be reset. For an even integer M (EN_0P5=0), the output clock $CLK_{PTU}$ follows the input clock $CLK_{IN0}$ without any phase shift; while for an odd integer M (EN_0P5=1), the signal of the output clock $CLK_{PTU}$ is forced to be zero while RST1 is high, and the phase toggles between 0° and 180° in reference to the input clock $CLK_{IN0}$ thereafter. As a result, the clock signal $CLK_{PTU}$ is normalized for every M/2 clock cycles regardless of whether M is even or odd. An example of the phase toggling unit 401 is detailed in FIG. 5. The phase toggling unit 401 comprises a data flip flop (DFF), and two logics generating SET and RESET signals for the DFF.

A subsequent counter 402 counts down the cycles of the adjusted clock signal $CLK_{PTU}$ by clock cycles from K to 0. The output of the counter 402 is a multiple-bit signal Q<N:0>. The counter 402 is implemented in conventional configurations of either an asynchronous (ripple) counter or a synchronous counter, which is used for high speed or low power applications, respectively.

Figure 6:
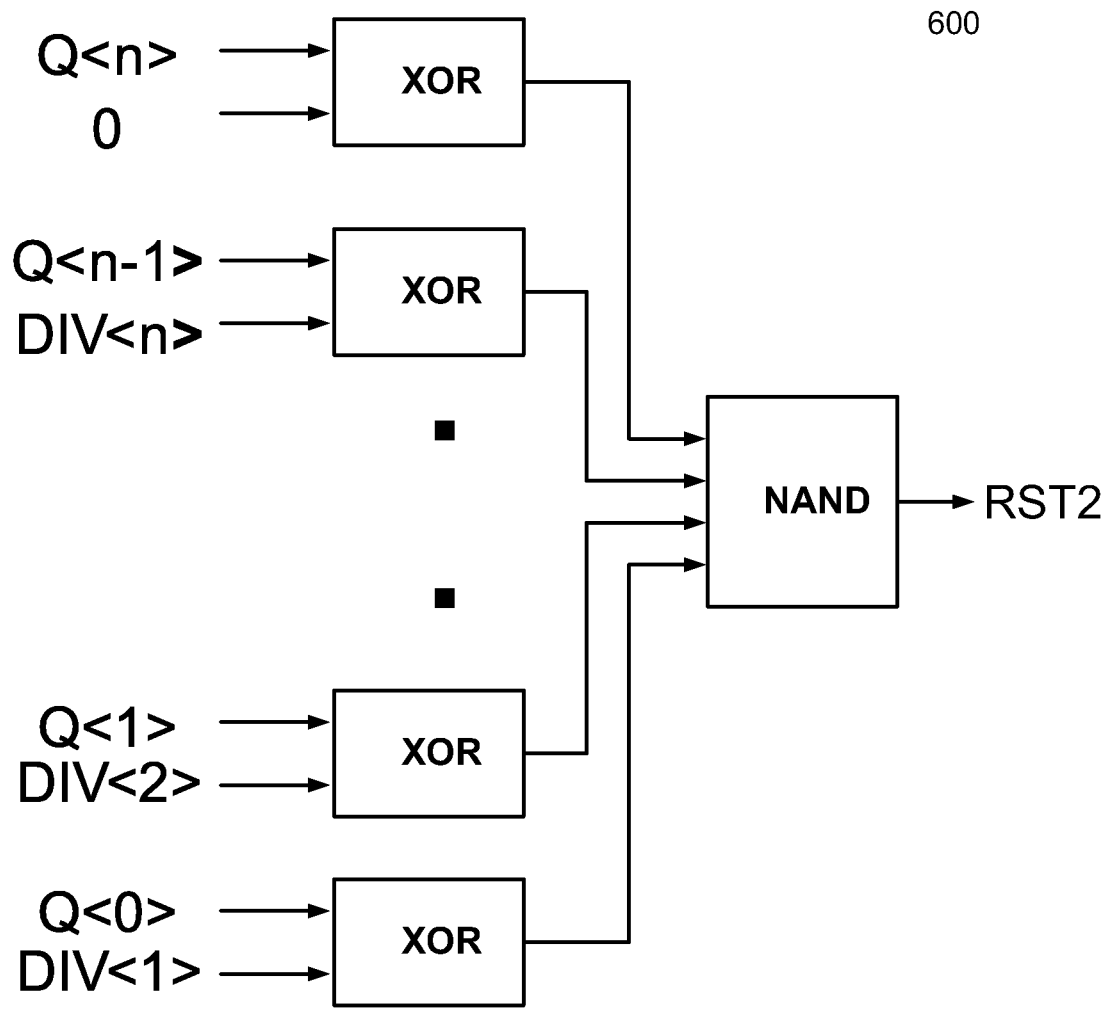
FIG. 6 illustrates a block diagram of a half-period detection circuit according to various embodiments of the invention.

The counter outputs are used by the counter reset detection block 403 and the half period detection block 404 to generate a reset signal RST1 and a half period signal RST2, respectively. RST1 is enabled once the counter output reaches zero. A simple set of NOR logic gates are sufficient to generate RST1 when the counter outputs Q<N:0> are all zero. One skilled in the art will recognize that an up counter may be used in place of the down counter and in this case, the reset signal RST1 is enabled once the counter output reaches the predetermined value of K. The half period control signal RST2 is enabled when K/2 (rounded if K is odd) clock cycles are counted. This half period signal RST2 does not stop the counter 402 to reach zero and it is also employed in the subsequent duty cycle equalizer 405. RST2 is generated by comparing the counter output Q<N:0> to the right-shifted signal DIV<N:0>, equal to K/2 if K is even or (K−1)/2 if K is odd. Right shift of the division ratio K by one bit is equivalent to dividing K by two. Therefore, when the counter 402 counts to K/2 for an even K or (K−1)/2 for an odd K, RST2 is enabled. An example of the embodiments that may be used to implement the comparison for generating RST2 is shown in FIG. 6.

Figure 7:
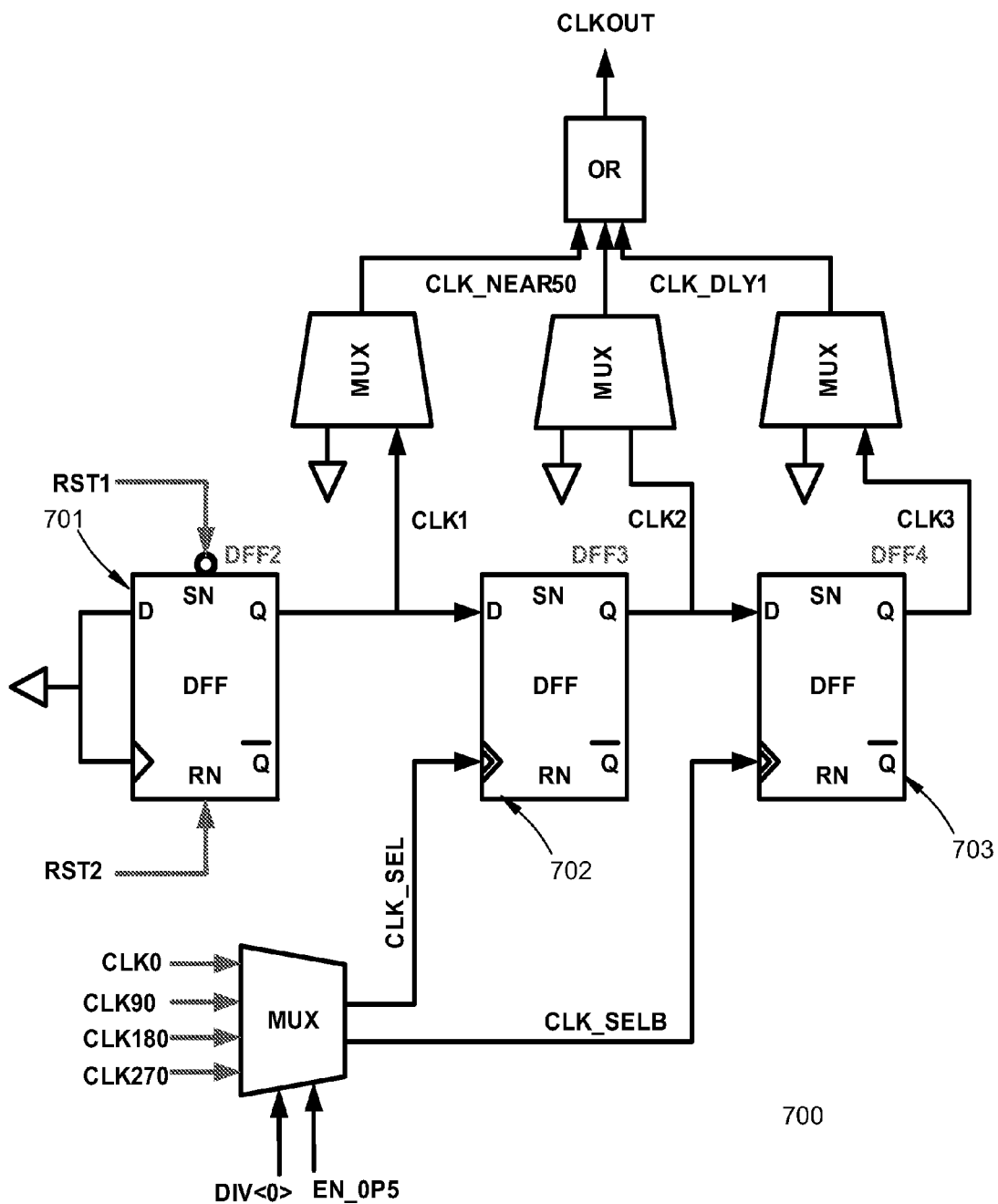
FIG. 7 illustrates a block diagram of a duty cycle equalizer according to various embodiments of the invention.
Figure 8:
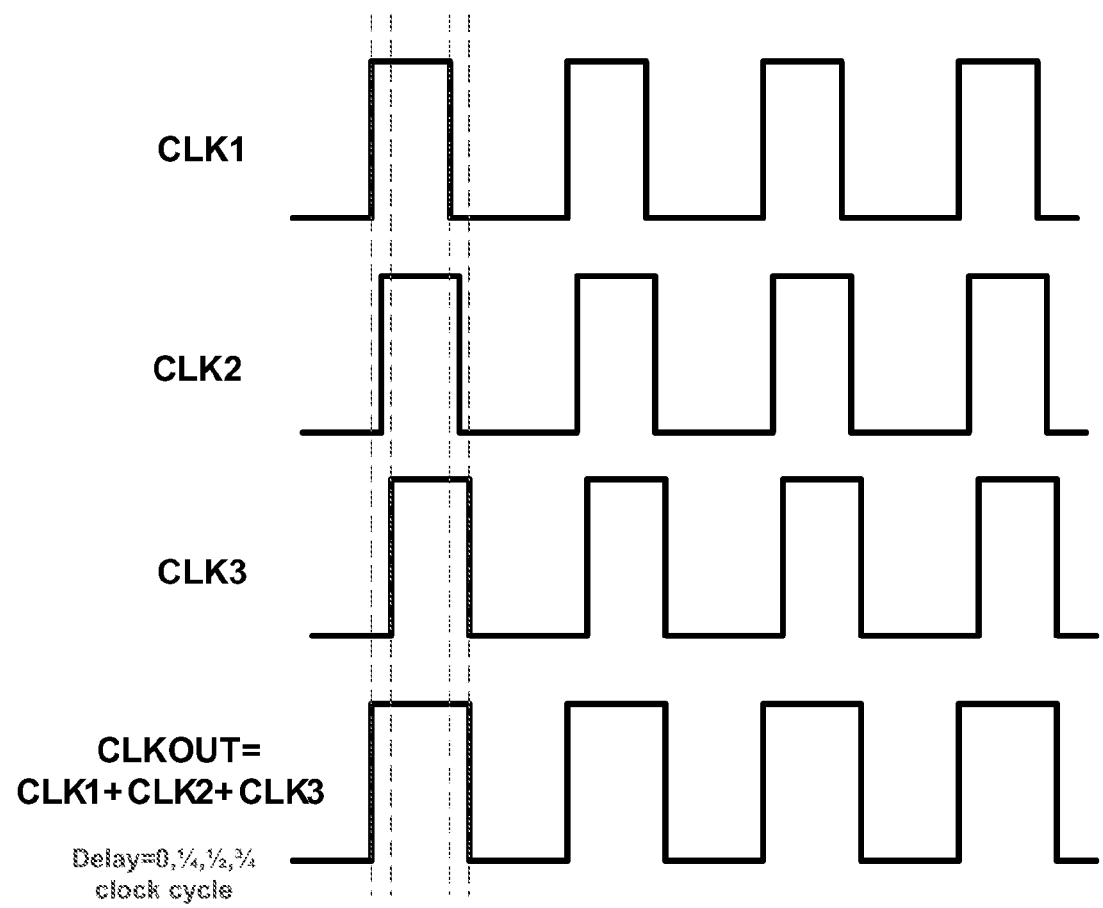
FIG. 8 illustrates a method of equalizing the clock duty cycle according to various embodiments of the invention.

FIG. 7 illustrates a block diagram 700 of a duty cycle equalizer. A clock signal CLK1 is generated as the output of a data flip-flop 701 is forced to high and low upon receiving enabling RST1 and RST2, respectively. The frequency of this clock signal CLK1 is 2/M times of the input reference clock and the duty cycle is determined by the offset between RST1 and RST2. Additional delays may be introduced by subsequent data flip-flops 702 and 703 to generate two delayed clock signals CLK2 and CLK3. The divide-by-M/2 divider output is generated by combining CLK1, CLK2, and CLK3 through an OR logic gate. The amount of compensation introduced to the duty cycle is determined by the delays in CLK2 and CLK3. FIG. 8 illustrates this method of compensation and duty cycle equalization.

The delay in the data flip-flop 702 is introduced by a signal selected from $CLK_{IN0}$, $CLK_{IN90}$, $CLK_{IN180}$ or $CLK_{IN270}$, which are the clock signals of different phases generated by the phase-locked loop. $CLK_{IN180}$ and $CLK_{IN270}$ are merely complementary signals of the in-phase and quadrature-phase clock signals $CLK_{IN0}$ and $CLK_{IN90}$, respectively. A clock signal complementary to the selected clock is employed to introduce delay to CLK3 relative to CLK2 in the data flip-flop 703.

The duty cycle equalizer 700 is intended to compensate for any duty cycle offset created inside the counters. The clock signal CLK1 generated from RST1 and RST2 does not necessarily have 50% duty cycles. In particular, for an odd M (EN_0P5=1), the aforementioned function blocks are never capable of generating a ¼ clock-cycle offset from the input clock to balance the duty cycle. Another ½ clock cycle loss occurs in the counter 402 for an odd K no matter M is odd or even. Therefore, when the integers M and K have various combinations of even or odd parity, the duty cycle may require compensations up to ¾ clock cycles. Table 1 shows the target compensations and the input clock signals selected to introduce specific delays.

TABLE 1

The selected duty cycle used for compensation by the duty cycle equalizer 700

| Division Ratio M | Division Ratio K | EN_0P5 | Selected Clock (CLK_SEL) phase | Compensation of Duty Cycle (in input clock cycle) |
|---|---|---|---|---|
| Even (4n) | Even (2n) | 0 | 0° ($CLK_{IN0}$) | 0 |
| Odd (4n + 1) | Even (2n) | 1 | 90° ($CLK_{IN90}$) | ¼ |
| Even (4n + 2) | Odd (2n + 1) | 0 | 180° ($CLK_{IN180}$) | ½ |
| Odd (4n + 3) | Odd (2n + 1) | 1 | 270° ($CLK_{IN270}$) | ¾ |

One skilled in the art will recognize that the divide-by-M/2 divider 400 is merely one embodiment to achieve the functions of avoiding frequency increase, reducing the clock frequency to the target frequency and equalizing the duty cycle. Other embodiments may still comprise counters and duty cycle equalizer. However, the incoming clock signal generated by the phase-locked loop may or may not need preprocessing by an embodiment as the phase toggling unit 401 prior to the counter. The counter may count up or down to a specified cycle other than K/2 as far as the duty mismatch and necessary compensation is accurately monitored. Moreover, although the duty cycle equalizer 405 relies on an OR logic to compensate for insufficient cycles, in certain embodiments, the counter may over-count more than needed and the duty cycle equalizer has to use an AND logic to eliminate the excessive cycles.

The clock signal generated by the divide-by-M/2 divider has a duty cycle of 50%, which facilitates quadrature-phase clock generation by the next stage divide-by-two divider. In one embodiment, two latches triggered at rising and falling edges, respectively, are sufficient to generate the in-phase and quadrature-phase clock signals having a target fractional-M frequency.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

I claim:

1. A digital frequency divider comprises:
    a phase toggling unit, coupled to receive a first in-phase clock, a reset signal and a fraction-enable signal, the phase toggling unit generates a phase toggling clock that is modified from the first in-phase clock under control of the fraction-enable signal;
    counter, coupled to receive the phase toggling clock, the reset signal and a first multiple-bit signal, the counter counts a number of clock cycles defined by the first multiple-bit signal and generates a second multiple-bit signal;
    a counter reset detection block, coupled to receive the second multiple-bit signal, the counter reset detection block generates a reset signal upon the second multiple-bit signal reaching a predefined number;
    a half period detection block, coupled to receive the first and the second multiple-bit signals, the half period detection block generates a half period signal identifying an approximate mid-point within the number of clock cycles defined by the first multiple-bit signal; and
    a duty cycle equalizer, coupled to receive the reset signal and the half period signal, the first in-phase clock and a first quadrature-phase clock, the duty cycle equalizer generates an intermediate clock having the 50% duty cycle at a second frequency.

2. The digital frequency divider of claim 1 further comprises a divide-by-two digital frequency divider, coupled to receive the intermediate clock, the divide-by-two digital frequency divider generates a second in-phase clock and a second quadrature-phase clock.

3. The digital frequency divider of claim 1 wherein the half period detection block uses a bit shift operation on the first multiple-bit signal to identify the approximate mid-point within the number of clock cycles defined by the first multiple-bit signal.

4. The digital frequency divider of claim 1 wherein the duty cycle equalizer comprises a first data flip flop that generates a first output clock from the reset signal and the half period signal, the first output clock not having an equal duty cycle.

5. The digital frequency divider of claim 4 wherein the duty cycle equalizer comprises a second data flip flop, coupled to receive the first output clock, the second data flip flop generates a second output clock having a delay relative to the first output clock.

6. The digital frequency divider of claim 5 wherein the duty cycle of the first output clock is compensated to 50% by combining the first and second output clocks using combinational logic.

7. The digital frequency divider of claim 5 wherein the duty cycle equalizer comprises a third data flip flop, coupled to receive the second output clock, the third data flip flop generates a third output clock having a delay relative to the second output clock.

8. The digital frequency divider of claim 7 wherein the duty cycle of the first output clock is compensated to 50% by combining the first, second and third output clocks using combinational logic.

* * * * *